United States Patent
Yanashima et al.

(10) Patent No.: US 10,236,663 B2
(45) Date of Patent: Mar. 19, 2019

(54) SEMICONDUCTOR OPTICAL DEVICE

(71) Applicant: SONY CORPORATION, Tokyo (JP)

(72) Inventors: Katsunori Yanashima, Kanagawa (JP); Kunihiko Tasai, Mikyagi (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/570,860

(22) PCT Filed: Mar. 11, 2016

(86) PCT No.: PCT/JP2016/057731
§ 371 (c)(1),
(2) Date: Oct. 31, 2017

(87) PCT Pub. No.: WO2016/185771
PCT Pub. Date: Nov. 24, 2016

(65) Prior Publication Data
US 2018/0138662 A1    May 17, 2018

(30) Foreign Application Priority Data
May 20, 2015 (JP) .................. 2015-102563

(51) Int. Cl.
*H01S 5/34* (2006.01)
*H01S 5/343* (2006.01)
(Continued)

(52) U.S. Cl.
CPC ............ *H01S 5/3407* (2013.01); *H01S 5/026* (2013.01); *H01S 5/0287* (2013.01); *H01S 5/22* (2013.01);
(Continued)

(58) Field of Classification Search
CPC ...... H01S 5/3407; H01S 5/34346; H01S 5/22; H01S 5/0287; H01S 5/34333; H01S 5/026; H01S 2304/04
See application file for complete search history.

(56) References Cited

U.S. PATENT DOCUMENTS

| 2002/0053676 | A1  | 5/2002  | Kozaki           |
| 2003/0132448 | A1  | 7/2003  | Tsujimura et al. |
| 2013/0320299 | A1* | 12/2013 | Li ............ H01L 33/06 257/13 |

FOREIGN PATENT DOCUMENTS

| CA | 2415056 A | 12/2002 |
| CN | 1440579 A | 9/2003  |

(Continued)

OTHER PUBLICATIONS

International Search Report and Written Opinion of PCT Application No. PCT/JP2016/057731, dated Jun. 7, 2016, 08 pages of ISRWO.

*Primary Examiner* — Dung Nguyen
(74) *Attorney, Agent, or Firm* — Chip Law Group

(57) ABSTRACT

A semiconductor optical device includes a laminated structure constituted of a first compound semiconductor layer of an n type, an active layer, and a second compound semiconductor layer of a p type, the active layer including at least 3 barrier layers and well layers interposed among the barrier layers, and the semiconductor optical device satisfying $Eg_{p\text{-}BR} > Eg_{n\text{-}BR} > Eg_{Well}$ when a bandgap energy of the barrier layer adjacent to the second compound semiconductor layer is represented by $Eg_{p\text{-}BR}$, a bandgap energy of the barrier layer between the well layers is represented by $Eg_{Well}$, and a bandgap energy of the barrier layer adjacent to the first compound semiconductor layer is represented by $Eg_{n\text{-}BR}$.

14 Claims, 7 Drawing Sheets

(51) Int. Cl.
*H01S 5/026* (2006.01)
*H01S 5/028* (2006.01)
*H01S 5/22* (2006.01)

(52) U.S. Cl.
CPC .......... *H01S 5/343* (2013.01); *H01S 5/34333* (2013.01); *H01S 5/34346* (2013.01); *H01S 2304/04* (2013.01)

(56) References Cited

FOREIGN PATENT DOCUMENTS

| | | |
|---|---|---|
| EP | 1313187 A1 | 5/2003 |
| JP | 2000-232259 A | 8/2000 |
| JP | 2000-261106 A | 9/2000 |
| JP | 2002-223042 A | 8/2002 |
| JP | 2003-31902 A | 1/2003 |
| JP | 2003-031902 A | 1/2003 |
| JP | 2006-165519 A | 6/2006 |
| KR | 10-2006-0089758 A | 8/2006 |
| TW | 200306042 A | 11/2003 |

\* cited by examiner

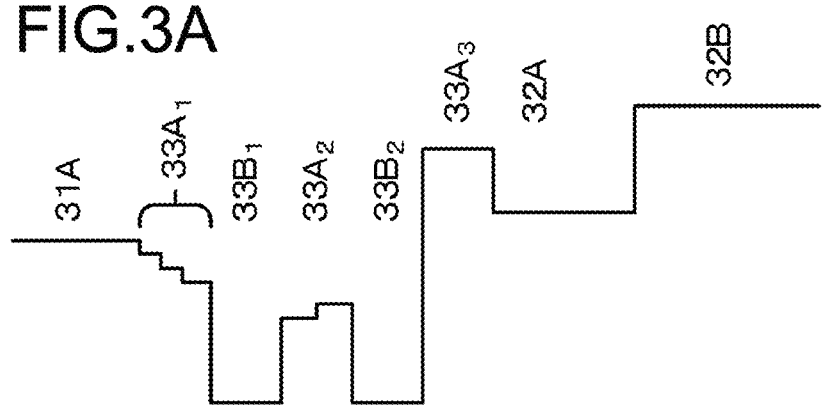
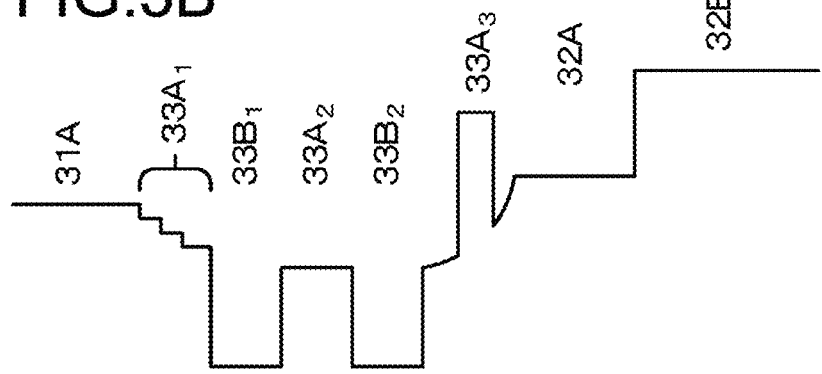

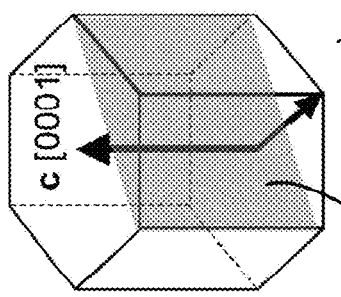
FIG. 8A
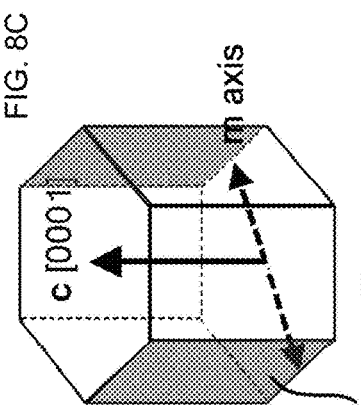
FIG. 8B
FIG. 8C
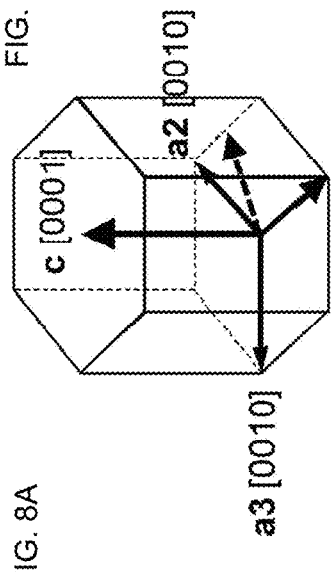
FIG. 8D
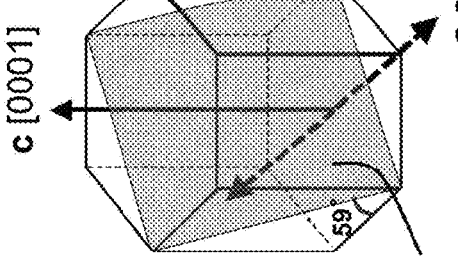
FIG. 8E

SEMICONDUCTOR OPTICAL DEVICE

CROSS REFERENCE TO RELATED APPLICATIONS

This application is a U.S. National Phase of International Patent Application No. PCT/JP2016/057731 filed on Mar. 11, 2016, which claims priority benefit of Japanese Patent Application No. JP 2015-102563 filed in the Japan Patent Office on May 20, 2015. Each of the above-referenced applications is hereby incorporated herein by reference in its entirety.

TECHNICAL FIELD

The present disclosure relates to a semiconductor optical device.

BACKGROUND ART

Green semiconductor laser devices are being developed actively for practical applications. The green semiconductor laser device can be used as a laser display, a laser pointer, and the like. In a semiconductor laser device of the past that includes a laminated structure that is constituted of an AlInGaN-based compound semiconductor and obtained by laminating a first compound semiconductor layer of an n type, an active layer, and a second compound semiconductor layer of a p type, an electronic barrier layer is normally formed in the second compound semiconductor layer for suppressing electron overflow (see, for example, Japanese Patent Application Laid-open No. 2006-165519). Here, the electron overflow is a phenomenon in which electrons supplied from the first compound semiconductor layer are not used for light emission in the active layer and are transmitted to the second compound semiconductor layer, and this causes lowering of luminance efficiency and deterioration of temperature characteristics. For suppressing the electron overflow, an electronic barrier layer constituted of AlGaN having a sufficiently large bandgap energy with respect to the active layer is provided in a part of the second compound semiconductor layer adjacent to the active layer. A value of the bandgap energy of the electronic barrier layer is higher than that of a layer having a highest bandgap energy value out of the layers configuring the second compound semiconductor layer excluding the electronic barrier layer, and is Mg-doped.

CITATION LIST

Patent Literature

Patent Literature 1: Japanese Patent Application Laid-open No. 2006-165519

DISCLOSURE OF INVENTION

Technical Problem

Incidentally, for preventing voltage characteristics from deteriorating, high-concentration p-type doping to the electronic barrier layer is necessary. Therefore, a threshold current increases by optical losses due to such a high-concentration dopant. Particularly in a green semiconductor laser device, the increase of a threshold current due to optical losses is prominent and becomes a large problem. Further, if a doping concentration is lowered for reducing optical losses, voltage characteristics are deteriorated, and a sufficient barrier effect cannot be obtained. By merely eliminating the electronic barrier layer, the electron overflow is caused to thus lower luminance efficiency and deteriorate temperature characteristics.

Therefore, the present disclosure aims at providing a semiconductor optical device including a configuration and structure with which suppression of electron overflow can be realized without providing an electronic barrier layer of the past.

Solution to Problem

For attaining the object described above, a semiconductor optical device according to the present disclosure includes a laminated structure including a first compound semiconductor layer of an n type, an active layer, and a second compound semiconductor layer of a p type, the active layer including at least 3 barrier layers and well layers interposed among the barrier layers, and the semiconductor optical device satisfying Expression (1) below when a bandgap energy of the barrier layer adjacent to the second compound semiconductor layer is represented by $Eg_{p\text{-}BR}$, a bandgap energy of the barrier layer between the well layers is represented by $Eg_{Well}$, and a bandgap energy of the barrier layer adjacent to the first compound semiconductor layer is represented by $Eg_{n\text{-}BR}$.

$$Eg_{p\text{-}BR} > Eg_{n\text{-}BR} > Eg_{Well} \tag{1}$$

Advantageous Effects of Invention

In the semiconductor optical device according to the present disclosure, since Expression (1) is satisfied, the value of $Eg_{Well}$ is small, and electrons are apt to be transmitted to the well layer on the second compound semiconductor layer side. On the other hand, since the value of $Eg_{p\text{-}BR}$ is large, transmission to the second compound semiconductor layer from the well layer is suppressed. Based on such a reason, electron overflow can be suppressed, and luminance efficiency and temperature characteristics can be improved. In addition, because it is unnecessary to form an electronic barrier layer into which a p-type dopant is doped at a high concentration, it becomes possible to lower a threshold current and obtain higher photoelectric conversion efficiency. It should be noted that the effects described in the specification are mere examples and should not be limited, and additional effects may be obtained.

BRIEF DESCRIPTION OF DRAWINGS

FIGS. 3A and 3B are diagrams schematically showing the conduction band minimum (CBM) according to the modified example of the compound semiconductor layer configuring the semiconductor optical device of Example 1.

FIGS. 8A, 8B, 8C, 8D, and 8E are schematic diagrams showing a crystalline structure of a hexagonal system nitride semiconductor for explaining a polar surface, a non-polar surface, and a semipolar surface of a nitride semiconductor crystal.

MODES FOR CARRYING OUT THE INVENTION

Figure 1A:
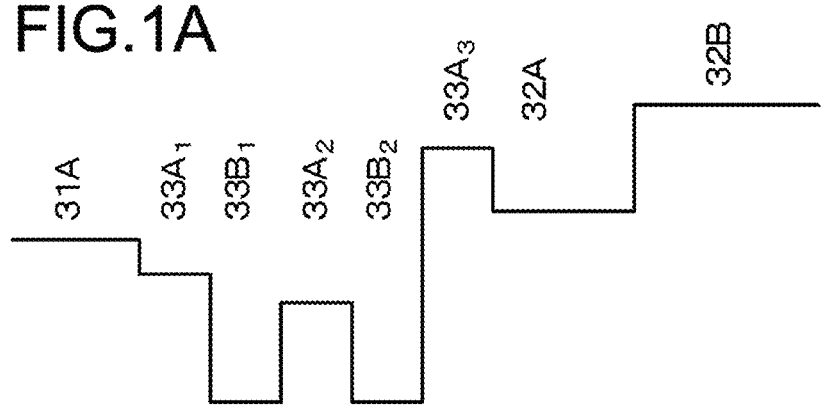
FIGS. 1A, 1B, and 1C are diagrams schematically showing compound semiconductor layers configuring a semiconductor optical device of Example 1 and a conduction band minimum (CBM) according to a modified example thereof.

Hereinafter, the present disclosure will be described on the basis of embodiments with reference to the drawings, but the present disclosure is not limited to the embodiments, and various numerical values and materials in the embodiments are examples. It should be noted that the descriptions will be given in the following order.

1. Descriptions on overall semiconductor optical device according to present disclosure
2. Example 1 (semiconductor optical device of present disclosure: semiconductor optical device according to first embodiment of present disclosure)
3. Example 2 (modified example of Example 1: semiconductor optical device according to second embodiment of present disclosure)
4. Others <Descriptions on Overall Semiconductor Optical Device According to Present Disclosure>

In the semiconductor optical device according to the present disclosure (hereinafter, referred to as "semiconductor optical device according to first embodiment of present disclosure" for convenience), the second compound semiconductor layer may be configured by a second light guide layer and a second clad layer from the active layer side, and the semiconductor optical device may satisfy Expression (2) below when a bandgap energy of the second light guide layer is represented by $Eg_{p\text{-}LG}$, and a bandgap energy of the second clad layer is represented by $Eg_{p\text{-}CL}$.

$$Eg_{p\text{-}LG} < Eg_{p\text{-}BR} < Eg_{p\text{-}CL} \qquad (2)$$

It should be noted that in a case where the second light guide layer and the second clad layer include a superlattice structure, the bandgap energy of the second light guide layer and the second clad layer refers to a bandgap energy between sub-bands in the superlattice structure. Moreover, in a case where the bandgap energy of the second light guide layer is changed, the highest bandgap energy value of the second light guide layer only needs to be set to $Eg_{p\text{-}LG}$, and in a case where the bandgap energy of the second clad layer is changed, the lowest bandgap energy value of the second clad layer only needs to be set to $Eg_{p\text{-}CL}$.

In the semiconductor optical device according to the first embodiment of the present disclosure including the favorable mode above, the first compound semiconductor layer may be configured by a first light guide layer and a first clad layer from the active layer side, and the semiconductor optical device may satisfy Expression (3) below when a bandgap energy of the first light guide layer is represented by $Eg_{n\text{-}LG}$, and a bandgap energy of the first clad layer is represented by $Eg_{n\text{-}CL}$.

$$Eg_{n\text{-}BR} < Eg_{n\text{-}LG} < Eg_{n\text{-}CL} \qquad (3)$$

In the semiconductor optical device according to the first embodiment of the present disclosure including the various favorable modes described above, the barrier layer adjacent to the second compound semiconductor layer may have a thickness of 25 nm or less. Further, in this case, it is favorable for the barrier layer adjacent to the second compound semiconductor layer to have a thickness of 1 nm or more and 5 nm or less. If the barrier layer adjacent to the second compound semiconductor layer is too thick, there is a fear that an optical confinement factor will be reduced to thus increase a threshold current. On the other hand, if it is too thin, there is a fear that an electron blocking effect becomes small.

Further, in the semiconductor optical device according to the first embodiment of the present disclosure including the various favorable modes described above, the second compound semiconductor layer may be configured by laminating a plurality of compound semiconductor layers, and the compound semiconductor layer having a highest bandgap energy out of the plurality of compound semiconductor layers configuring the second compound semiconductor layer may have a thickness of $3*10^{-8}$ m or more.

Furthermore, in the semiconductor optical device according to the first embodiment of the present disclosure including the various favorable modes described above, the barrier layer adjacent to the second compound semiconductor layer may be compositionally modulated, and a highest value of the bandgap energy may satisfy Expression (1). Alternatively, the barrier layer adjacent to the second compound semiconductor layer may include a multistep composition structure in which a composition changes stepwise, and a highest value of the bandgap energy may satisfy Expression (1).

Furthermore, in the semiconductor optical device according to the first embodiment of the present disclosure including the various favorable modes and configurations described above, it is favorable to satisfy $$Eg_p - Eg_n \geq 20 \text{ meV}$$

$$Eg_n - Eg_{Well} \geq 20 \text{ meV}$$

Further, in the semiconductor optical device according to the first embodiment of the present disclosure including the various favorable modes and configurations described above, the laminated structure may be constituted of an AlInGaN-based compound semiconductor, and the semiconductor optical device may configure a light-emitting device. In this case, each of the barrier layers may be constituted of $Al_xIn_yGa_{(1-X-Y)}N$ (provided that X≥0, Y≥0), and the semiconductor optical device may satisfy Expression (4) below when a value of Y in the barrier layer adjacent to the second compound semiconductor layer is represented by $Y_{p\text{-}BR}$, a value of Y in the barrier layer between the well layers is represented by $Y_{Well}$, and a value of Y in the barrier layer adjacent to the first compound semiconductor layer is represented by $Y_{n\text{-}BR}$.

$$Y_{p\text{-}BR} < Y_{n\text{-}BR} < Y_{Well} \qquad (4)$$

Furthermore, in the semiconductor optical device according to the first embodiment of the present disclosure including the various favorable modes and configurations described above, the second compound semiconductor layer may be configured so as to not include an electronic barrier layer.

Compositions of the well layers and barrier layers in the semiconductor optical device can be measured on the basis of a 3D atom probe (3DAP), for example. Regarding the 3D atom probe, refer to, for example, http://www.nanoanalysis.co.jp/business/case_example_49.html.

In the semiconductor optical device according to the first embodiment of the present disclosure including the various favorable modes and configurations described above, the semiconductor optical device may emit light having a wavelength of 440 nm or more and 600 nm, favorably light having a wavelength of 495 nm or more and 570 nm or less (green light).

From the past, when forming a plurality of well layers, the layers are caused to grow under the same epitaxial growth conditions. However, in a case of forming a plurality of well layers constituted of an AlInGaN-based compound semiconductor, even if the epitaxial growth conditions are set to be the same in terms of design, that is, even if deposition conditions (e.g., temperature and use gas amount) in a deposition apparatus for depositing the active layer are set to be the same, it was found that compositions of the obtained well layers (e.g., In compositions) largely fluctuate, with the result that a half bandwidth of laser light emitted from the semiconductor laser device cannot be narrowed, although details will be given later.

In such a case, in the semiconductor optical device according to the first embodiment of the present disclosure including the various favorable modes and configurations described above, the well layers may be constituted of an AlInGaN-based compound semiconductor, and a value obtained by subtracting, when an indium atom percentage of the AlInGaN-based compound semiconductor in each of the well layers is represented by $Z_{In}$, a minimum value of $Z_{In}$ from a maximum value of $Z_{In}$ in the well layers of the active layer may be 0.01 or less. It should be noted that the semiconductor optical device having such a configuration will hereinafter be called "semiconductor optical device according to second embodiment of present disclosure" for convenience.

A method of producing a semiconductor optical device according to the second embodiment of the present disclosure includes controlling a base temperature and/or a raw gas mixture ratio when forming well layers based on a metalorganic chemical vapor deposition method (MOCVD method), to set a value obtained by subtracting, when the indium atom percentage of the AlInGaN-based compound semiconductor in each of the well layers is represented by $Z_{In}$, a minimum value of $Z_{In}$ from a maximum value of $Z_{In}$ ($\Delta Z = Z_{In-max} - Z_{In-min}$) in the well layers of the active layer to be 0.01 or less.

In the semiconductor optical device according to the second embodiment of the present disclosure or the production method thereof, a value obtained by subtracting, when the indium atom percentage of the AlInGaN-based compound semiconductor in each of the well layers is represented by $Z_{In}$, the minimum value of $Z_{In}$ from the maximum value of $Z_{In}$ ($\Delta Z = Z_{In-max} - Z_{In-min}$) in the well layers of the active layer is 0.01 or less. Accordingly, it becomes possible to suppress wavelength variances of light generated in the active layer, narrow a half bandwidth of light emitted from the semiconductor optical device, for example, and thus provide a semiconductor optical device including excellent light emission characteristics.

In the semiconductor optical device according to the second embodiment of the present disclosure, a distortion amount distribution may exist in an epitaxial growth direction in the well layer adjacent to the first compound semiconductor layer, and a first atomic layer adjacent to the first compound semiconductor layer may have a largest distortion amount. Further, in this case, in each of the well layers, a tension distortion may be introduced in the first atomic layer positioned on the first compound semiconductor layer side in the epitaxial growth direction.

It is possible to check whether a distortion is introduced on the basis of a distortion analysis by GPA (Geometric Phase Analysis). In GPA, a lattice image is subjected to Fourier transform, a mask is caused to act on a specific spot, and an inverse Fourier transform is performed using that spot as an original point. In a case where there is no lattice change at all, an amplitude of the image subjected to the inverse Fourier transform is constant, and a phase also becomes constant. In a case where there is a lattice change, a phase $P_g(r)$ of the image subjected to the inverse Fourier transform is proportional to a deviation $u(r)$ of a lattice fringe with respect to a basic cycle.

$$P_g(r) = -2\pi g \cdot u(r)$$

Here, "g" is a reciprocal lattice vector corresponding to the selected basic cycle. Since the phase $P_g(r)$ is an inner product of the reciprocal lattice vector g and the lattice fringe deviation vector u(r), the lattice fringe deviation in a direction of the selected spot (direction vertical to fringe of basic cycle) is calculated. In addition, the actual lattice deviation u(r) can be obtained on the basis of a lattice deviation calculated from two nonparallel spots. Since the lattice deviation is accumulated also in a case where the lattice change is small with respect to the basic cycle, the phases are integrated. Therefore, the lattice distortion of about sub-% can be calculated by GPA. If a lattice interval is constant in a certain area, a phase gradient becomes constant. Conversely, an area where there is a change in the phase gradient expresses a change in the lattice interval. Therefore, the lattice distortion is obtained by a change in a phase diagram. Here, as a technology unique to GPA, a method that more-accurately sets a diffraction point corresponding to the basic cycle as an original point is proposed. If there is a lattice distortion, each spot expands around the diffraction point corresponding to the basic cycle. Moreover, it is difficult to cause the diffraction point corresponding to the basic cycle and a calculation point of the Fourier transform to match accurately. In this regard, in GPA, this problem is solved as follows. Specifically, first, an original lattice image is subjected to the Fourier transform, and two nonparallel reciprocal lattice vectors g are selected. The inverse Fourier transform is performed while moving a maximum intensity position of each spot to an original point, and a phase based on the maximum intensity position is obtained. At this time, if the maximum intensity position differs from the diffraction point corresponding to the basic cycle, the phase gradient does not become 0 in an area corresponding to the basic cycle. Meanwhile, using this fact, the phase itself is adjusted so that the phase gradient becomes 0 in the area corresponding to the basic cycle. By obtaining the phases with respect to the two spots in this way, the lattice distortion is obtained.

In the semiconductor optical device according to the first embodiment of the present disclosure including the various favorable modes and configurations described above and in the semiconductor optical device according to the second embodiment of the present disclosure, the laminated structure may be formed on a main surface of a GaN substrate that is constituted of a semipolar surface or a nonpolar surface. In this case, an angle formed between a plane direction of the main surface and a c axis may be 45 degrees or more and 80 degrees or less, and the main surface of the GaN substrate may be constituted of a {20-21} surface. It should be noted that notations of crystal surfaces exemplified below regarding a hexagonal system will be described as {hk-il} surface and {h-kil} surface in the specification for convenience.

{hk$\bar{\text{i}}$l} surface

{h$\bar{\text{k}}$il} surface

The polar surface, nonpolar surface, and semipolar surface of a nitride semiconductor crystal will be described below with reference to FIGS. 8A 8B, 8C, 8D, and 8E. FIG. 8A is a schematic diagram showing a crystalline structure of a hexagonal system nitride semiconductor. FIG. 8B is a schematic diagram showing m surfaces as nonpolar surfaces, that is, {1-100} surfaces, and the m surfaces indicated as gray planes are surfaces vertical to an m-axis direction. FIG. 8C is a schematic diagram showing an a surface as a nonpolar surface, that is, a {11-20} surface, and the a surface indicated as a gray plane is a surface vertical to an a-axis direction. FIG. 8D is a schematic diagram showing a {20-21} surface as a semipolar surface. A [20-21] direction vertical to the {20-21} surface indicated as a gray plane is tilted 75 degrees in the m-axis direction from the c axis. FIG. 8E is a schematic diagram showing a {11-22} surface as a semipolar surface. A [11-22] direction vertical to the {11-22} surface indicated as a gray plane is tilted 59 degrees in the a-axis direction from the c axis. It should be noted that angles formed between the plane directions of the various crystal surfaces and the c axis are shown in Table 1 below. It should be noted that surfaces expressed as {11-2n} surface such as a {11-21} surface, the {11-22} surface, and a {11-24} surface, a {1-101} surface, a {1-102} surface, and a {1-103} surface are semipolar surfaces.

TABLE 1

| Plane direction | Angle formed with respect to c axis (degrees) |
|---|---|
| {1-100} | 90.0 |
| {11-20} | 90.0 |
| {20-21} | 75.1 |
| {11-21} | 72.9 |
| {1-101} | 62.0 |
| {11-22} | 58.4 |
| {1-102} | 43.2 |
| {1-103} | 32.0 |

In the semiconductor optical device according to the second embodiment of the present disclosure including the various favorable modes and configurations described above, the value of $Z_{In}$ in each of the well layers may be 0.15 or more and 0.50 or less, favorably 0.20 or more and 0.45 or less. In this case, the semiconductor optical device may emit light having a wavelength of 440 nm or more and 600 nm or less, favorably 495 nm or more and 570 nm or less. Further, in these modes, the barrier layers may be constituted of an AlInGaN-based compound semiconductor, and when an indium atom percentage of the AlInGaN-based compound semiconductor in the barrier layers is represented by $Y_{In}$, a value of $Y_{In}$ in the barrier layers may be 0.08 or less (including 0).

As the semiconductor optical device according to the first embodiment of the present disclosure including the various favorable modes and configurations described above and the semiconductor optical device according to the second embodiment of the present disclosure including the various favorable modes and configurations described above (hereinafter, these will collectively be referred to as "semiconductor optical device according to present disclosure, and the like"), an end surface emission type semiconductor laser device, an end surface emission type super luminescent diode (SLD), or a semiconductor optical amplifier can be used. The semiconductor optical amplifier amplifies in a direct light state without converting light signals into electric signals, includes a laser structure from which a resonator effect is eliminated as much as possible, and amplifies incident light on the basis of an optical gain of the semiconductor optical amplifier. In the semiconductor laser device, a resonator is configured by optimizing optical reflectance at the first end surface (light-emitting end surface) and optical reflectance at the second end surface (light reflection end surface), and light is emitted from the first end surface. Alternatively, an external resonator may be provided. On the other hand, in the super luminescent diode, the optical reflectance in the first end surface is set to a very low value and the optical reflectance in the second end surface is set to a very high value so that light generated in the active layer is reflected by the second end surface and emitted from the first end surface without configuring a resonator. In the semiconductor laser device and the super luminescent diode, a non-reflective coating layer (AR) or a low-reflection coating layer is formed in the first end surface, and a high-reflection coating layer (HR) is formed in the second end surface. Moreover, in the semiconductor optical amplifier, the optical reflectance in the first end surface and the second end surface is set to a very low value so that light that has entered from the second end surface is amplified and emitted from the first end surface without configuring a resonator. It should be noted that the structure of the semiconductor optical device according to the present disclosure, and the like can also be applied to a surface-emitting laser device (vertical resonator laser, also called VCSEL).

A high-reflection coating layer (HR) is formed on the light reflection end surface. As the non-reflective coating layer (low-reflection coating layer), a laminated structure constituted of at least two types of layers selected from the group consisting of a titanium oxide layer, a tantalum oxide layer, a zirconium oxide layer, a silicon oxide layer, an aluminum oxide layer, an aluminum nitride layer, and a silicon nitride layer can be used, and it can be formed on the basis of a PVD method such as a sputtering method and a vacuum vapor deposition method.

As the semiconductor laser device, a semiconductor laser device including a ridge-stripe-type separate confinement heterostructure (SCH structure) can be used. Alternatively, a semiconductor laser device including an oblique-ridge-stripe-type separate confinement heterostructure can be used. In other words, a configuration in which an axis line of the semiconductor laser device and an axis line of the ridge stripe structure intersect at a predetermined angle can be taken. Here, as a predetermined angle φ, 0.1 degrees ≤ φ ≤ 10 degrees can be exemplified. The axis line of the ridge stripe structure is a straight line connecting a bisection point between both ends of the ridge stripe structure in the light-emitting end surface and a bisection point between both ends of the ridge stripe structure in the light reflection end surface. Further, the axis line of the semiconductor laser device indicates an axis line orthogonal to a virtual vertical surface of the light-emitting end surface and a virtual vertical surface of the light reflection end surface. The planar shape of the ridge stripe structure may be linear or may be curved. Alternatively, a semiconductor laser device including a tapered (flared) ridge-stripe-type (including, for example, a configuration that monotonically and gradually widens in a tapered manner from the light-emitting end surface toward the light reflection end surface and a configuration that is first widened from the light-emitting end surface toward the light reflection end surface and then narrowed after exceeding a maximum width) separate confinement heterostructure can be used. The ridge stripe structure may be configured from a part of the second compound semiconductor layer in a thickness direction, may be configured by the second compound semiconductor layer and the active layer, or may be configured from a part of the second compound semiconductor layer, the active layer, and the first compound semiconductor layer in the thickness direction. It should be noted that the semiconductor laser device is not limited to these structures. In addition, as the semiconductor laser device, a semiconductor laser device including an index guide structure, a bisection-type semiconductor laser device in which a light-emitting area and a saturable absorption area are apposed in a resonator direction, a multi-section-type (multi-electrode-type) semiconductor laser device, a SAL (Saturable Absorber Layer)-type semiconductor laser device in which a light-emitting area and a saturable absorption area are arranged in a vertical direction, and a WI (Weakly Index guide)-type semiconductor laser device in which a saturable absorption area is provided along a ridge stripe structure can be used.

As described above, as the compound semiconductor configuring the first compound semiconductor layer, the active layer, and the second compound semiconductor layer, there is the AlInGaN-based compound semiconductor such as GaN, AlGaN, InGaN, and AlInGaN. Further, these compound semiconductors may include, as necessary, a boron (B) atom, a thallium (Tl) atom, an arsenic (As) atom, a phosphorus (P) atom, and an antimony (Sb) atom. As a method of forming these layers (deposition method), there are a metalorganic chemical vapor deposition method (MOCVD method, MOVPE method), a metalorganic molecular beam epitaxy method (MOMBE method), a hydride vapor phase epitaxy method (HVPE method) in which a halogen contributes to transportation or reaction, a plasma-assisted physical chemical vapor deposition method (PPD method), an atomic layer deposition method (ALD method), and a migration-enhanced epitaxy (MEE) method. Here, as organic gallium source gas in the MOCVD method, trimethylgallium (TMG) gas and triethyl gallium (TEG) gas can be used, and ammonia gas and hydrazine gas can be used as nitrogen source gas. Further, in a case where aluminum (Al) or indium (In) is included as a constituent atom of the AlInGaN-based compound semiconductor layer, trimethylaluminum (TMA) gas only needs to be used as the Al source, and trimethylindium (TMI) gas only needs to be used as the In source. Furthermore, silane gas ($SiH_4$ gas) only needs to be used as the Si source, and cyclopentadienyl magnesium gas, methylcyclopentadienyl magnesium, and biscyclopentadienyl magnesium ($Cp_2Mg$) only need to be used as the Mg source. In the case of forming the ridge stripe structure from the laminated structure constituted of the first compound semiconductor layer, the active layer, and the second compound semiconductor layer, there are a combination of a lithography technology and a wet etching technology and a combination of a lithography technology and a dry etching technology as a method of etching the laminated structure for forming the ridge stripe structure. The laminated structure is formed on the GaN substrate and includes a structure in which the first compound semiconductor layer, the active layer, and the second compound semiconductor layer are laminated from the GaN substrate side as described above.

As a specific combination of the active layer including a multi-quantum well structure (MQW structure) (compound semiconductor configuring well layers and compound semiconductor configuring barrier layers), (InGaN, GaN), (InGaN, AlInGaN), and (InGaN, InGaN) [provided that In composition of InGaN configuring well layers and In composition of InGaN configuring barrier layers differ] can be exemplified. The number of well layers is two or more, and the number of barrier layers is a value obtained by adding "1" to the number of well layers.

It is only necessary to introduce impurities into each of the first compound semiconductor layer and the second compound semiconductor layer for giving a conductivity type of an n type to the first compound semiconductor layer and a conductivity type of a p type to the second compound semiconductor layer. As the n-type impurity to be added to the compound semiconductor layer, there are, for example, silicon (Si), sulfur (S), selenium (Se), germanium (Ge), tellurium (Te), tin (Sn), carbon (C), titanium (Ti), oxygen (O), and palladium (Pd), and as the p-type impurity, there are zinc (Zn), magnesium (Mg), carbon (C), beryllium (Be), cadmium (Cd), calcium (Ca), and barium (Ba).

The first compound semiconductor layer is electrically connected to a first electrode, and the second compound semiconductor layer is electrically connected to a second electrode. The second electrode may be configured to have a single layer configuration or a multilayer configuration that includes at least one type of metal (including alloy) selected from the group consisting of, for example, palladium (Pd), nickel (Ni), platinum (Pt), gold (Au), cobalt (Co), and rhodium (Rh) (e.g., laminated structure of palladium layer/platinum layer in which palladium layer is in contact with second compound semiconductor layer or laminated structure of palladium layer/nickel layer in which palladium layer is in contact with second compound semiconductor layer). It is desirable for the first electrode to have a single layer configuration or a multilayer configuration that includes at least one type of metal (including alloy) selected from the group consisting of, for example, gold (Au), silver (Ag), palladium (Pd), platinum (Pt), nickel (Ni), Al (aluminum), Ti (titanium), tungsten (W), vanadium (V), chromium (Cr), Cu (copper), Zn (zinc), tin (Sn), and indium (In), and, for example, Ti/Au, Ti/Al, Ti/Pt/Au, Ti/Al/Au, Ti/Pt/Au, Ni/Au, Ni/Au/Pt, Ni/Pt, Pd/Pt, and Ag/Pd can be exemplified. It should be noted that the layers preceding "/" in the multilayer configuration are positioned more on the active layer side. The same holds true in descriptions below. Although the first electrode is electrically connected to the first compound semiconductor layer, a configuration in which the first electrode is formed on the first compound semiconductor layer and a configuration in which the first electrode is connected to the first compound semiconductor layer via a conductive material layer or a GaN substrate are also included. The first electrode and the second electrode can be deposited by, for example, a PVD method such as a vacuum vapor deposition method and a sputtering method.

A pad electrode may be provided on the first electrode and the second electrode for electrically connecting with an external electrode or circuit. It is desirable for the pad electrode to have a single layer configuration or a multilayer configuration that includes at least one type of metal (including alloy) selected from the group consisting of, for example, Ti (titanium), aluminum (Al), Pt (platinum), Au (gold), Ni (nickel), and Pd (palladium). Alternatively, the pad electrode can take a multilayer configuration exemplified by Ti/Pt/Au, multilayer configuration of Ti/Au, a multilayer configuration of Ti/Pd/Au, a multilayer configuration of Ti/Pd/Au, a multilayer configuration of Ti/Ni/Au, and a multilayer configuration of Ti/Ni/Au/Cr/Au.

Further, in a case where the second electrode is formed on or above the second compound semiconductor layer including the conductivity type of the p type, a transparent conductive material layer may be formed between the second electrode and the second compound semiconductor layer. As the transparent conductive material configuring the transparent conductive material layer, indium tin oxide (ITO, Indium Tin Oxide, including Sn-doped $In_2O_3$, crystalline ITO, and amorphous ITO), indium zinc oxide (IZO, Indium Zinc Oxide), IFO (F-doped $In_2O_3$), tin oxide ($SnO_2$), ATO (Sb-doped $SnO_2$), FTO (F-doped $SnO_2$), and zinc oxide (ZnO, including Al-doped ZnO and B-doped ZnO) can be exemplified.

The semiconductor optical device according to the present disclosure, and the like are applicable to a display apparatus, for example. Specifically, as such a display apparatus, there are a projector apparatus, image display apparatus, and monitor apparatus that include the semiconductor optical device according to the present disclosure, and the like as light sources, and a reflection-type liquid crystal display apparatus, head-mounted display (HMD), head-up display (HUD), and various lightings that include the semiconductor optical device according to the present disclosure, and the like as light sources. In addition, the semiconductor optical device according to the present disclosure, and the like can be used as a light source of a microscope. It should be noted that the present disclosure is not limited to these fields.

Example 1

Figure 4A:
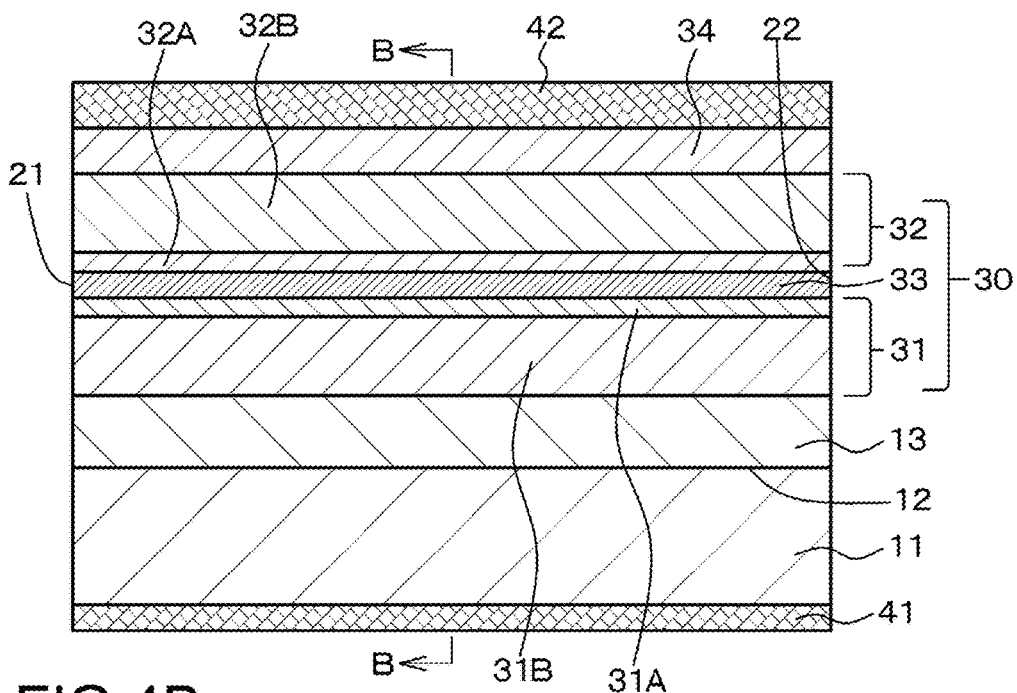
FIGS. 4A and 4B are a schematic cross-sectional diagram and a partial cross-sectional diagram of the semiconductor optical device of Example 1.
Figure 4B:
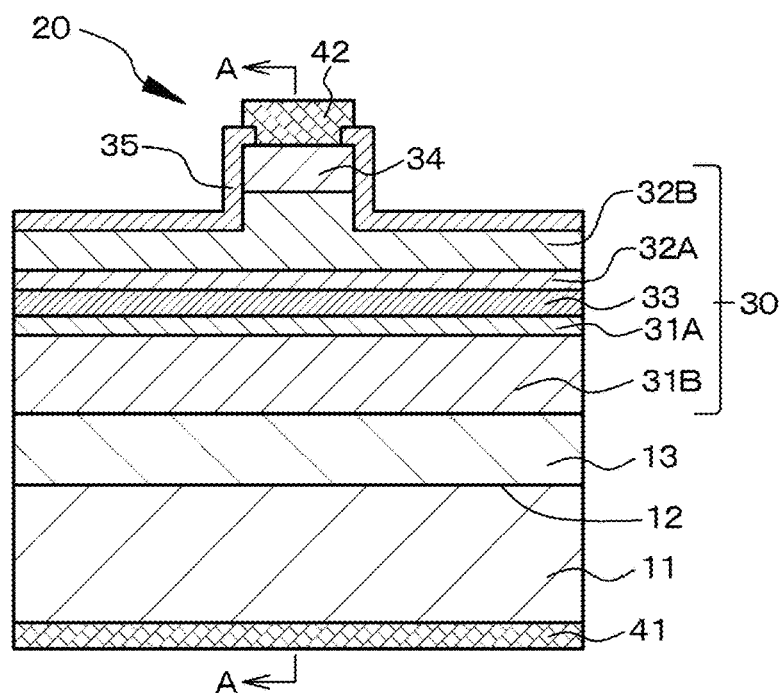

Example 1 relates to a semiconductor optical device according to a first embodiment of the present disclosure. Specifically, the semiconductor optical device of Example 1 is constituted of an end surface emission type semiconductor laser device, more specifically, a semiconductor laser device including a ridge-stripe-type separate confinement heterostructure. Schematic partial cross-sectional diagrams of the semiconductor optical device according to Example 1 are shown in FIGS. 4A and 4B. It should be noted that FIG. 4A is a schematic partial cross-sectional diagram taken along the arrow A-A of FIG. 4B and is a schematic partial cross-sectional diagram obtained when the semiconductor optical device is cut at a virtual plane parallel to a direction in which a waveguide structure (resonator structure) extends. Moreover, FIG. 4B is a schematic partial cross-sectional diagram taken along the arrow B-B of FIG. 4A and is a schematic partial cross-sectional diagram obtained when the semiconductor optical device is cut at a virtual plane vertical to the direction in which the waveguide structure (resonator structure) extends. Furthermore, a conduction band minimum (CBM) of the compound semiconductor layer configuring the semiconductor optical device according to Example 1 is schematically shown in FIG. 1A.

The semiconductor optical device according to Example 1 or Example 2 to be described later includes a laminated structure 30 constituted of a first compound semiconductor layer 31 of an n type, an active layer (light-emitting layer) 33, and a second compound semiconductor layer 32 of a p type, and the active layer 33 includes at least 3 barrier layers $33A_1$, $33A_2$, and $33A_3$ and well layers $33B_1$ and $33B_2$ interposed among the barrier layers $33A_1$, $33A_2$, and $33A_3$. Specifically, the first-layer well layer (first well layer) $33B_1$ is interposed between the first-layer barrier layer (first barrier layer) $33A_1$ and the second-layer barrier layer (second barrier layer) $33A_2$, and the second-layer well layer (second well layer) $33B_2$ is interposed between the second-layer barrier layer (second barrier layer) $33A_2$ and the third-layer barrier layer (third barrier layer) $33A_3$. Then, when a bandgap energy of the barrier layer (third barrier layer) $33A_3$ adjacent to the second compound semiconductor layer is represented by $Eg_{p\text{-}BR}$, a bandgap energy of the barrier layer (second barrier layer) $33A_2$ between the well layers $33B_1$ and $33B_2$ is represented by $Eg_{Well}$, and a bandgap energy of the barrier layer (first barrier layer) $33A_1$ adjacent to the first compound semiconductor layer is represented by $Eg_{m\text{-}BR}$, Expression (1) below is satisfied. It should be noted that in FIGS. 4A and 4B, the active layer is illustrated as a single layer.

$$Eg_{p\text{-}BR} > Eg_{n\text{-}BR} > Eg_{Well} \qquad (1)$$

Here, specifically, $$Eg_p - Eg_n \geq 20 \text{ meV}$$

$$Eg_n - Eg_{Well} \geq 20 \text{ meV}$$

are satisfied.

In the semiconductor optical device according to Example 1 or Example 2 to be described later, the second compound semiconductor layer 32 is configured by a second light guide layer 32A and a second clad layer 32B from the active layer side, and when a bandgap energy of the second light guide layer 32A is represented by $Eg_{p\text{-}LG}$ and a bandgap energy of the second clad layer 32B is represented by $Eg_{p\text{-}CL}$, Expression (2) below is satisfied. A contact layer 34 is formed on the second compound semiconductor layer 32. The first compound semiconductor layer 31 is configured by a first light guide layer 31A and a first clad layer 31B from the active layer side, and when a bandgap energy of the first light guide layer 31A is represented by $Eg_{n\text{-}LG}$ and a bandgap energy of the first clad layer 31B is represented by $Eg_{n\text{-}CL}$, Expression (3) is satisfied.

$$Eg_{p\text{-}LG} < Eg_{p\text{-}BR} < Eg_{p\text{-}CL} \qquad (2)$$

$$Eg_{n\text{-}BR} < Eg_{n\text{-}LG} < Eg_{n\text{-}CL} \qquad (3)$$

Furthermore, in the semiconductor optical device according to Example 1 or Example 2 to be described later, the barrier layer $33A_3$ adjacent to the second compound semiconductor layer has a thickness of 25 nm or less, favorably 1 nm or more and 5 nm or less, specifically, 2.5 nm. Moreover, the second compound semiconductor layer 32 is configured by laminating a plurality of compound semiconductor layers (specifically, configured by second light guide layer 32A and second clad layer 32B), and the compound semiconductor layer having a highest bandgap energy out of the plurality of compound semiconductor layers configuring the second compound semiconductor layer 32 (specifically, second clad layer 32B) has a thickness of $3*10^{-8}$ m or more, more specifically, 400 nm. An electronic barrier layer is not provided in the second compound semiconductor layer 32.

Furthermore, in the semiconductor optical device according to Example 1 or Example 2 to be described later, the laminated structure 30 is constituted of an AlInGaN-based compound semiconductor, and a light-emitting device is configured. In addition, in this case, each of the barrier layers $33A_1$, $33A_2$, and $33A_3$ is constituted of $Al_XIn_YGa_{(1-X-Y)}N$ (provided that X≥0, Y≥0), and when a value of Y in the barrier layer adjacent to the second compound semiconductor layer (third barrier layer $33A_3$) is represented by $Y_{p\text{-}BR}$, a value of Y in the barrier layer between the well layers (second barrier layer $33A_2$) is represented by $Y_{Well}$, and a value of Y in the barrier layer adjacent to the first compound semiconductor layer (first barrier layer $33A_1$) is represented by $Y_{n\text{-}BR}$, Expression (4) below is satisfied.

$$Y_{p\text{-}BR} < Y_{n\text{-}BR} < Y_{Well} \quad (4)$$

Further, the semiconductor optical device according to Example 1 or Example 2 to be described later emits light having a wavelength of 440 nm or more and 600 nm or less, favorably 495 nm or more and 570 nm or less (green light), more specifically, light having a peak wavelength of 530 nm.

In the semiconductor optical device according to Example 1 or Example 2 to be described later, the laminated structure 30 is formed on a main surface 12 of a GaN substrate 11 that is constituted of a semipolar surface or a nonpolar surface. In this case, an angle formed between a plane direction of the main surface and the c axis is 45 degrees or more and 80 degrees or less. More specifically, in Example 1, the main surface of the GaN substrate 11 is constituted of a {20-21} surface as a semipolar surface. To the GaN substrate 11, silicon (Si), oxygen (O), or germanium (Ge) is added as the n-type impurity. Further, the laminated structure 30 includes a first end surface 21 that emits light and a second end surface 22 opposing the first end surface 21. High-reflection coating layers (HR) are formed on the light-emitting end surface (first end surface) and the light reflection end surface (second end surface), but illustrations of these coating layers are omitted. It should be noted that optical reflectance of the light-emitting end surface (first end surface) 21 is smaller than that of the light reflection end surface (second end surface) 22. In the example shown in the figures, the planar shape of the ridge stripe structure 20 is linear. Moreover, the ridge stripe structure 20 is formed by partially etching the second compound semiconductor layer 32 in a thickness direction. An area of the active layer 33 below the ridge stripe structure 20 corresponds to a light-emitting area (current injection area). The ridge stripe structure 20 and both sides thereof are covered by an insulation layer 35 formed of $SiO_2$, SiN, or $Al_2O_3$. A part of the insulation layer 35 at a top surface of the second compound semiconductor layer 32 is removed, and a second electrode 42 formed by laminating a Pd layer, a Pt layer, and an Au layer is formed on a top surface of the contact layer 34 formed above the second compound semiconductor layer 32. Moreover, a first electrode 41 formed by laminating a Ti layer, a Pt layer, and an Au layer is formed on a back surface (surface opposing main surface 12) of the GaN substrate 11.

Figure 7A:
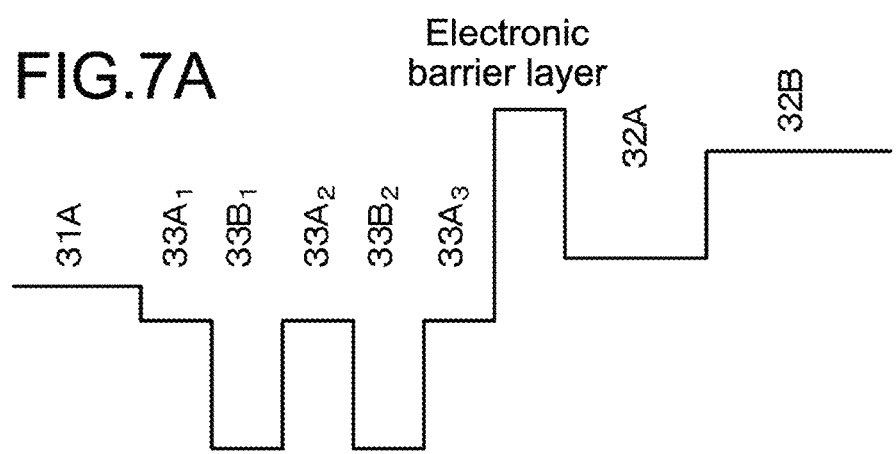
FIGS. 7A and 7B are diagrams schematically showing conduction band minimums (CBM) of the compound semiconductor layers configuring the semiconductor optical devices of Modified Example 1A and Modified Example 1B, respectively.
Figure 7B:
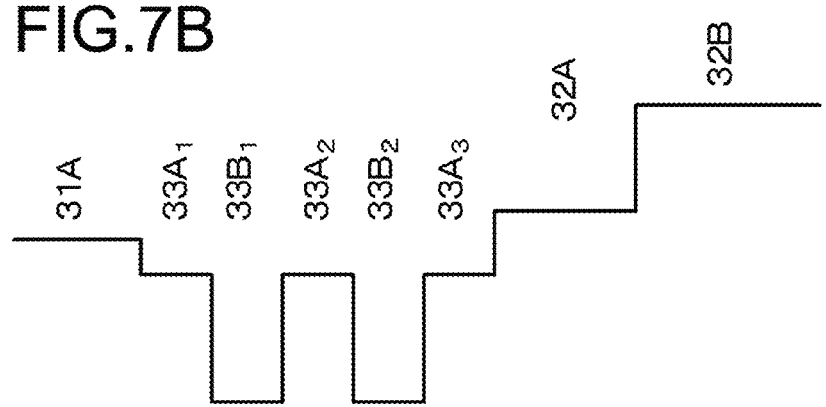

Compositions of the respective layers configuring the laminated structure 30 in the semiconductor optical device (semiconductor laser device) according to Example 1 and compositions of the respective layers configuring the laminated structure 30 in the semiconductor optical devices according to Comparative Example 1A (semiconductor laser device of past including electronic barrier layer) and Comparative Example 1B (semiconductor laser device of past not including electronic barrier layer) are shown in Table 2 below, but the compound semiconductor layer described in the bottom row is formed on the n-type GaN substrate 11. Moreover, the conduction band minimums (CBMs) of the compound semiconductor layers configuring the semiconductor optical devices according to Comparative Examples 1A and 1B are schematically shown in FIGS. 7A and 7B, respectively. A specific combination of (compound semiconductor configuring well layers and compound semiconductor configuring barrier layers) in the active layer 33 including a multi-quantum well structure (MQW structure) is (InGaN, InGaN) in Example 1 [provided that composition of InGaN configuring well layers and composition of InGaN configuring barrier layers differ], but is not limited to such a combination. The same holds true in Example 2. The second clad layer 32B and the electronic barrier layer in Comparative Example 1A are Mg-doped, and the first light guide layer 31A and the first clad layer 31B are Si-doped. Moreover, the well layers, the barrier layers, and the second light guide layer 32A are undoped layers.

TABLE 2

| | Thickness (nm) | Example 1 | Ratio of In | Eg |
|---|---|---|---|---|
| Example 1 | | | | |
| Contact layer | 50 | p$^+$-GaN | | |
| Second compound semiconductor layer | | | | |
| Second clad layer | 400 | Al0.05GaN | | 3.47 |
| Electronic barrier layer | | Null | | |
| Second light guide layer | 75 | $In_{0.025}Ga_{0.975}N$ | 0.025 | 3.28 |
| Active layer | | | | |
| Third barrier layer | 2.5 | $In_{0.01}Ga_{0.99}N$ | 0.01 | 3.36 |
| Second well layer | 2.5 | $In_{0.30}Ga_{0.70}N$ | 0.30 | 2.30 |
| Second barrier layer | 2.5 | $In_{0.08}Ga_{0.92}N$ | 0.08 | 2.99 |
| First well layer | 2.5 | $In_{0.30}Ga_{0.70}N$ | 0.30 | 2.30 |
| First barrier layer | 2.5 | $In_{0.06}Ga_{0.94}N$ | 0.06 | 3.10 |
| First compound semiconductor layer | | | | |
| First light guide layer | 123 | n-$In_{0.045}Ga_{0.955}N$ | 0.045 | 3.17 |
| First clad layer | 1200 | n-$Al_{0.14}In_{0.03}GaN$ | | 3.51 |
| Base layer | | n-GaN | | |
| Substrate | | n-GaN | | |
| Comparative Example 1A | | | | |
| Contact layer | 50 | p$^+$-GaN | | |
| Second compound semiconductor layer | | | | |
| Second clad layer | 400 | Al0.05GaN | | 3.47 |
| Electronic barrier layer | 10 | p-$Al_{0.10}Ga_{0.90}N$ | | 3.52 |
| Second light guide layer | 75 | $In_{0.025}Ga_{0.975}N$ | 0.025 | 3.28 |
| Active layer | | | | |
| Third barrier layer | 2.5 | $In_{0.06}Ga_{0.94}N$ | 0.06 | 3.10 |
| Second well layer | 2.5 | $In_{0.30}Ga_{0.70}N$ | 0.30 | 2.30 |
| Second barrier layer | 2.5 | $In_{0.06}Ga_{0.94}N$ | 0.06 | 3.10 |
| First well layer | 2.5 | $In_{0.30}Ga_{0.70}N$ | 0.30 | 2.30 |
| First barrier layer | 2.5 | $In_{0.06}Ga_{0.94}N$ | 0.06 | 3.10 |
| First compound semiconductor layer | | | | |
| First light guide layer | 123 | n-$In_{0.045}Ga_{0.955}N$ | 0.045 | 3.17 |
| First clad layer | 1200 | n-$Al_{0.14}In_{0.03}GaN$ | | 3.51 |
| Base layer | | n-GaN | | |
| Substrate | | n-GaN | | |
| Comparative Example 1B | | | | |
| Contact layer | 50 | p$^+$-GaN | | |
| Second compound semiconductor layer | | | | |
| Second clad layer | 400 | Al0.05GaN | | 3.47 |
| Electronic barrier layer | 10 | Null | | |
| Second light guide layer | 75 | $In_{0.025}Ga_{0.975}N$ | 0.025 | 3.28 |

TABLE 2-continued

| | Thickness (nm) | Example 1 | Ratio of In | Eg |
|---|---|---|---|---|
| Active layer | | | | |
| Third barrier layer | 2.5 | $In_{0.06}Ga_{0.94}N$ | 0.06 | 3.10 |
| Second well layer | 2.5 | $In_{0.30}Ga_{0.70}N$ | 0.30 | 2.30 |
| Second barrier layer | 2.5 | $In_{0.06}Ga_{0.94}N$ | 0.06 | 3.10 |
| First well layer | 2.5 | $In_{0.30}Ga_{0.70}N$ | 0.30 | 2.30 |
| First barrier layer | 2.5 | $In_{0.06}Ga_{0.94}N$ | 0.06 | 3.10 |
| First compound semiconductor layer | | | | |
| First light guide layer | 123 | $n-In_{0.045}Ga_{0.955}N$ | 0.045 | 3.17 |
| First clad layer | 1200 | $n-Al_{0.14}In_{0.03}GaN$ | | 3.51 |
| Base layer | | n-GaN | | |
| Substrate | | n-GaN | | |

Figure 5:
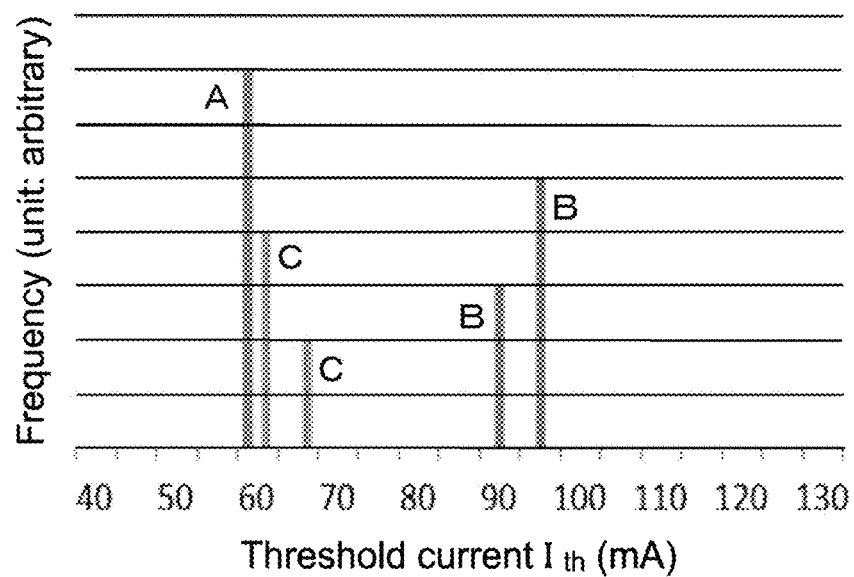
FIG. 5 is a graph showing threshold current measurement results of the semiconductor optical devices according to Example 1, Modified Example 1A, and Modified Example 1B.
Figure 6:
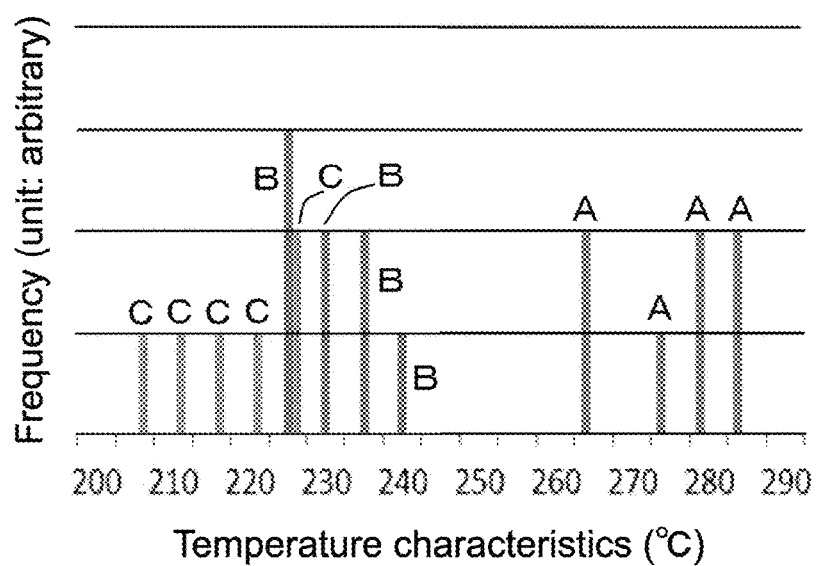
FIG. 6 is a graph showing temperature characteristics measurement results of the semiconductor optical devices according to Example 1, Modified Example 1A, and Modified Example 1B.

Threshold current measurement results obtained in the semiconductor optical devices according to Example 1 and Comparative Examples 1A and 1B are shown in FIG. 5. The abscissa axis of FIG. 5 represents a threshold current $I_{th}$ (unit: milliampere), and the ordinate axis represents the number (frequency) of semiconductor optical devices. Comparing with the semiconductor optical device of Comparative Example 1A (semiconductor laser device of past including electronic barrier layer), the semiconductor optical device of Example 1 and the semiconductor optical device of Comparative Example 1B (semiconductor laser device of past not including electronic barrier layer) show low threshold current values. Temperature characteristics measurement results of the semiconductor optical devices according to Example 1 and Comparative Examples 1A and 1B are shown in FIG. 6. The abscissa axis of FIG. 6 represents temperature characteristics (unit: ° C.), and the ordinate axis represents the number (frequency) of semiconductor optical devices. Comparing with the semiconductor optical device of Comparative Example 1B (semiconductor laser device of past not including electronic barrier layer) and the semiconductor optical device of Comparative Example 1A (semiconductor laser device of past including electronic barrier layer), the semiconductor optical device of Example 1 shows excellent temperature characteristics. Further, from the results above, it was found that the semiconductor optical device of Example 1 shows a low threshold current value and has excellent temperature characteristics while suppressing electron overflow. It should be noted that in FIGS. 5 and 6, "A" indicates the result of Example 1, "B" indicates the result of Comparative Example 1A, and "C" indicates the result of Comparative Example 1B. It should be noted that the temperature characteristics can be expressed by the following definition formula. Here, $T_1$ and $T_2$ are each a case temperature of the semiconductor optical device, and $T_2 > T_1$ is satisfied. Moreover, $I_1$ and $I_2$ are each a drive current used when emitting an arbitrary light output value.

Characteristic temperature=$(T_2-T_1)/\ln(I_2/I_1)$

Figure 1B:
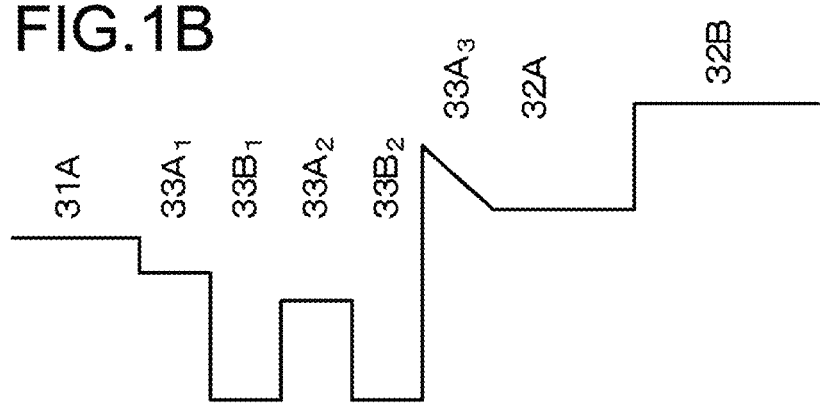
Figure 1C:
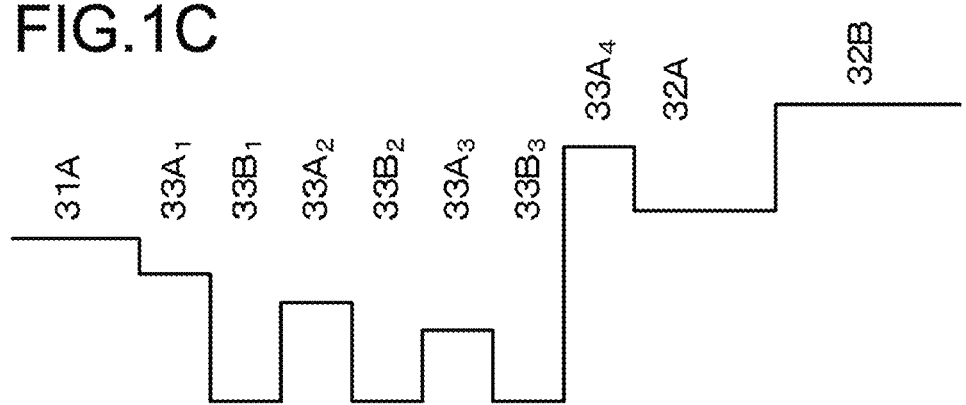

It should be noted that in the conduction band minimum (CBM) of the barrier layer (third barrier layer) $33A_3$ adjacent to the second compound semiconductor layer 32 as shown in FIG. 1B, the third barrier layer $33A_3$ may be compositionally modulated, and a highest value of the bandgap energy may satisfy Expression (1). Further, in the conduction band minimum (CBM) as shown in FIG. 1C, the active layer may include 3 well layers $33B_1$, $33B_2$, and $33B_3$ and 4 barrier layers $33A_1$, $33A_2$, $33A_3$, and $33A_4$. In this case, all the barrier layers $33A_2$ and $33A_3$ positioned between the well layers only need to satisfy Expression (1).

Figure 2A:
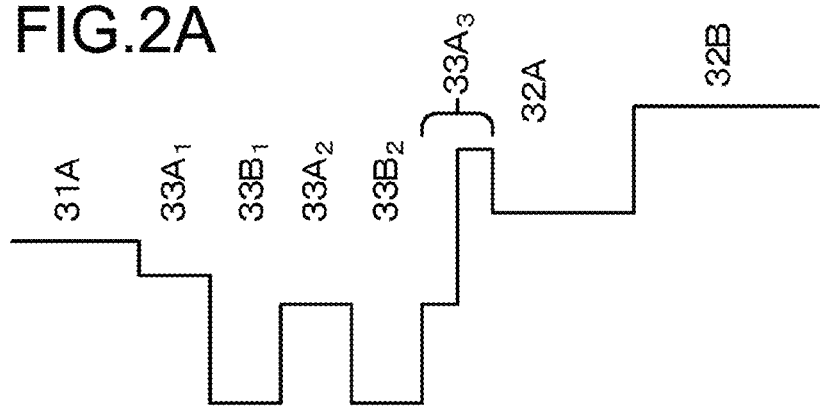
FIGS. 2A, 2B, and 2C are diagrams schematically showing the conduction band minimum (CBM) according to the modified example of the compound semiconductor layer configuring the semiconductor optical device of Example 1.
Figure 2B:
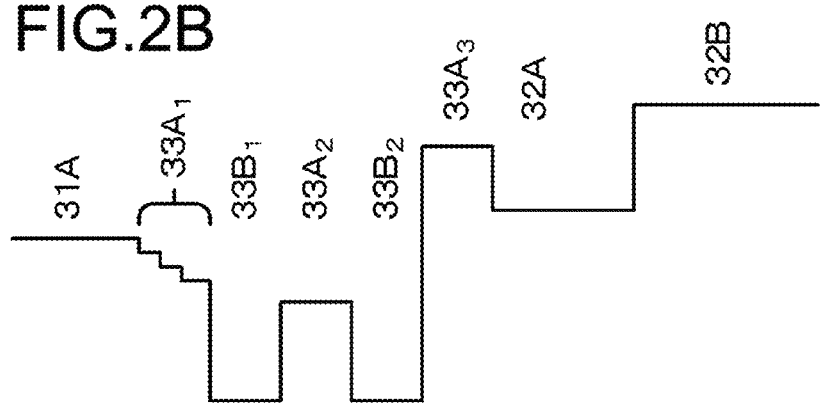
Figure 2C:
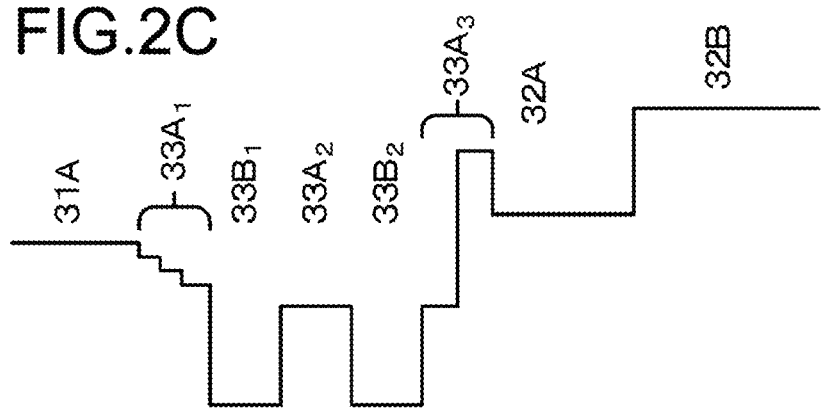

In the conduction band minimum (CBM) as shown in FIG. 2A, the barrier layer (third barrier layer) $33A_3$ adjacent to the second compound semiconductor layer 32 may include a multistep composition structure in which a composition changes stepwise, and a highest value of the bandgap energy may satisfy Expression (1). In the conduction band minimum (CBM) as shown in FIG. 2B, the barrier layer (first barrier layer) $33A_1$ adjacent to the first compound semiconductor layer 31 may include a multistep composition structure in which a composition changes stepwise, and in this case, a mean value of the bandgap energies of the first barrier layer $33A_1$ only needs to satisfy Expression (1). As shown in FIG. 2C, the third barrier layer $33A_3$ shown in FIG. 2A and the first barrier layer $33A_1$ shown in FIG. 2B may be combined. In a case where the value of the bandgap energy of the barrier layer positioned between the well layers is not constant, a minimum value of the bandgap energy only needs to be set to $Eg_{Well}$. Moreover, in the conduction band minimum (CBM) as shown in FIG. 3A, the second barrier layer $33A_2$ positioned between the first well layer $33B_1$ and the second well layer $33B_2$ may include a multistep composition structure in which a composition changes stepwise, and in this case, a mean value of the bandgap energies of the second barrier layer $33A_2$ only needs to satisfy Expression (1). Alternatively, in the conduction band minimum (CBM) as shown in FIG. 3B, the third barrier layer $33A_3$ may be inserted into a graded layer. The examples shown in FIGS. 3A and 3B may be combined with the various modified examples of Example 1 and the like.

Hereinafter, a general outline of the method of producing the semiconductor optical device according to Example 1 will be described.

[Process-100]

For example, the n-type GaN substrate 11 including, as the main surface 12, a {20-21} surface which is a semipolar surface is prepared. Then, the main surface 12 of this GaN substrate 11 is first cleaned by thermal cleaning and the like. Next, a buffer layer 13 is crystal-grown on the main surface 12 of this GaN substrate 11 at a growth temperature of, for example, 1000° C., on the basis of the MOCVD method. Subsequently, after causing the first clad layer 31B to grow while maintaining the growth temperature at, for example, 1000° C., the first light guide layer 31A, the active layer 33, the second light guide layer 32A, the second clad layer 32B, and the contact layer 34 are formed sequentially. In the first light guide layer 31A, the active layer 33, and the second light guide layer 32A, the growth temperature is lowered for improving intake of indium (In) atoms. For example, a formation temperature of the active layer 33 is set to be 720° C. or more and 780° C. or less. Then, the 3 barrier layers $33A_1$, $33A_2$, and $33A_3$ and the 2 well layers $33B_1$ and $33B_2$ are formed.

[Process-110]

Next, by forming an etching mask on the contact layer 34, etching the contact layer 34 by, for example, a RIE method, using this etching mask, and then partially etching the second compound semiconductor layer 32 in the thickness direction, the ridge stripe structure 20 is formed. After that, the etching mask is removed.

[Process-120]

After that, the insulation layer 35 is formed on the entire surface, and a part of the insulation layer 35 positioned on the top surface of the contact layer 34 is removed. Then, the second electrode 42 is formed on the exposed second compound semiconductor layer 32. Further, by wrapping or polishing the back surface side of the GaN substrate 11, for example, the thickness of the GaN substrate 11 is made to be about 100 µm, and then the first electrode 41 is formed on the back surface of the GaN substrate 11.

[Process-130]

Subsequently, the first end surface 21 and the second end surface 22 are formed by cleaving the laminated structure 30. Then, a coating layer of the first end surface 21 and the second end surface 22 is formed. Next, terminals and the like are formed by a well-known method for connecting electrodes with an external circuit and the like and are packaged or sealed, to complete the semiconductor optical device according to Example 1.

As described above, since Expression (1) is satisfied in the semiconductor optical device according to Example 1, it is possible to suppress electron overflow and improve luminance efficiency and temperature characteristics. In addition, because there is no need to form an electronic barrier layer doped with a p-type dopant at a high concentration, it is possible to lower the threshold current $I_{th}$ and obtain higher photoelectric conversion efficiency.

Example 2

Example 2 relates to a semiconductor optical device according to a second embodiment of the present disclosure. In Example 2, the active layer 33 includes a multi-quantum well structure including a plurality of well layers, and the well layers $33B_1$ and $33B_2$ are each constituted of an AlInGaN-based compound semiconductor. Specifically, in Example 2, the number of well layers is two, and the number of barrier layers is three. Further, when an indium atom percentage of the AlInGaN-based compound semiconductor in each of the well layers 33B is represented by $Z_{In}$, a value obtained by subtracting a minimum value $Z_{In-min}$ of $Z_{In}$ from a maximum value $Z_{In-max}$ of $Z_{In}$ in the well layers 33B of the active layer 33 ($\Delta Z=Z_{In-max}-Z_{In-min}$) is 0.01 or less.

In Example 2, the value of $Z_{In}$ in each of the well layers is 0.15 or more and 0.50 or less, favorably 0.20 or more and 0.45 or less. As described above, the semiconductor optical device emits light having a wavelength of 440 nm or more and 600 nm or less, favorably 495 nm or more and 570 nm or less. The barrier layers are each constituted of an AlInGaN-based compound semiconductor, and when an indium atom percentage of the AlInGaN-based compound semiconductor in the barrier layers is represented by $Y_{In}$, a value of $Y_{In}$ in the barrier layers is 0.08 or less. The laminated structure 30 is constituted of the AlInGaN-based compound semiconductor as described above, and the active layer 33 includes a quantum well structure in which the well layers constituted of the InGaN layers and the barrier layers constituted of InGaN layers are laminated as described above.

Hereinafter, a general outline of a method of producing the semiconductor optical device according to Example 2 will be described.

[Process-200]

For example, similar to [Process-100] of Example 1, layers up to the first light guide layer 31A is formed on the basis of the MOCVD method. Next, for example, the formation temperature of the active layer 33 is set to be 720° C. or more and 780° C. or less. Then, by controlling a base temperature and/or raw gas mixture ratio at a time of forming the well layers on the basis of the MOCVD method, a value obtained by subtracting, when an indium atom percentage of the AlInGaN-based compound semiconductor in each of the well layers is represented by $Z_{In}$, the minimum value $Z_{In-min}$ of $Z_{In}$ from the maximum value $Z_{In-max}$ of $Z_{In}$ in the well layers of the active layer 33 ($\Delta Z=Z_{In-max}-Z_{In-min}$) is set to be 0.01 or less. Specifically, in Example 2, the base temperature is controlled. More specifically, in Example 2, the first well layer $33B_1$ positioned on the first compound semiconductor layer 31 side in the active layer 33 is caused to grow at 740° C. Moreover, the second well layer $33B_2$ positioned on the second compound semiconductor layer 32 side in the active layer 33 is caused to grow at 743.0° C. Compositions of the first well layer $33B_1$ and the second well layer $33B_2$ measured on the basis of a 3D atomic probe are as shown in Table 3 below. It should be noted that the compositions of the compound semiconductor layers configuring the laminated structure 30 excluding the compositions of the first well layer $33B_1$ and the second well layer $33B_2$ are similar to those shown in Table 2.

TABLE 3

| First well layer $33B_1$: | $In_{0.258}Ga_{0.742}N$ |
|---|---|
| Second well layer $33B_2$: | $In_{0.263}Ga_{0.737}N$ |

[Process-210]

After that, processes similar to [Process-110] to [Process-130] of Example 1 are executed, to complete the semiconductor optical device according to Example 2.

Values of a difference $\Delta T$ (unit: ° C.) between the deposition temperature of the first well layer $33B_1$ and the deposition temperature of the second well layer $33B_2$ and $\Delta Z$ ($=Z_{In-max}-Z_{In-min}$) are shown in Table 4 below. Furthermore, values of a PL emission wavelength and full width half maximum (FWHM) of light emitted from the active layer of the semiconductor laser device (unit: nm) are shown in Table 4. It should be noted that in Comparative Examples 2A and 2B, the values of $\Delta T$ are 2.5° C. and 0° C., respectively.

TABLE 4

| | $\Delta T$ | $\Delta Z$ | Emission wavelength | FWHM |
|---|---|---|---|---|
| Example 2 | 3.0 | 0.005 | 529 | 38 |
| Comparative Example 2A | 2.5 | 0.008 | 528 | 42 |
| Comparative Example 2B | 0.0 | 0.019 | 528 | 49 |

In this way, in Example 2, by setting the value of $\Delta Z$ ($=Z_{In-max}-Z_{In-min}$) in the well layers of the active layer to be 0.01 or less, it becomes possible to suppress wavelength variances of light generated in the active layer 33 (specifically, it becomes possible to narrow half bandwidth of light emitted from semiconductor optical device) and provide a semiconductor optical device including excellent light emission characteristics. It should be noted that if a deposition apparatus changes, the relationship between $\Delta T$ and $\Delta Z$ also changes. In other words, the relationship between $\Delta T$ and $\Delta Z$ is a value that depends on the deposition apparatus. Therefore, for setting the value of $\Delta Z$ to be 0.01, various tests only need to be executed to determine an appropriate value of $\Delta T$. The value of $\Delta Z$ can also be changed by changing the raw gas mixture ratio. Therefore, for setting the value of $\Delta Z$ to be 0.01, various tests only need to be executed to determine an appropriate raw gas mixture ratio. Moreover, in the semiconductor optical device according to Example 2, it was confirmed that a distortion amount distribution exists in an epitaxial growth direction in the well layer adjacent to the first compound semiconductor layer 31, a first atomic layer adjacent to the first compound semiconductor layer 31 has a largest distortion amount, and furthermore, in each of the well layers (two well layers in Example 2), a tension distortion is introduced in the first atomic layer positioned on the first compound semiconductor layer 31 side in the epitaxial growth direction.

Heretofore, the present disclosure has been described on the basis of the favorable examples, but the present disclosure is not limited to these examples. The configurations and structures of the semiconductor optical device and the semiconductor optical device production method, that have been described in the examples, are mere examples and can be changed as appropriate. Although, the laminated structure is provided on the {20-21} surface of the GaN substrate as the main surface in the examples, the main surface of the GaN substrate is not limited to this, and other semipolar surfaces, nonpolar surfaces, and polar surfaces (C surface, {0001} surface) can be used. Further, although the semiconductor optical device is described as the semiconductor laser device alone, a super luminescent diode (SLD) or a semiconductor optical amplifier can also be used as the semiconductor optical device. It should be noted that configurations and structures of the SLD and semiconductor optical amplifier are substantially the same as those of the semiconductor optical devices according to Examples 1 and 2 except for the point that optical reflectance of a light-emitting end surface and that of a light reflection end surface differ.

Further, although the ridge stripe structure 20 extends linearly in the examples, the shape is not limited to this and may take a tapered shape or a flare shape instead of extending at a constant width. Specifically, for example, a configuration that monotonically and gradually widens in a tapered manner from the light-emitting end surface toward the light reflection end surface and a configuration that is first widened from the light-emitting end surface toward the light reflection end surface and then narrowed after exceeding a maximum width are also possible.

Furthermore, the semiconductor laser device may be a semiconductor laser device including an oblique-ridge-stripe-type separate confinement heterostructure, that includes an oblique waveguide. For example, it is desirable for such a semiconductor laser device to include a structure in which two linear ridge stripe structures are combined and a value of an angle $\varphi$ at which the two ridge stripe structures intersect to be, for example, $0 < \varphi \leq 10$ (degrees), favorably $0.1$ (degrees) $\leq \varphi \leq 6$ (degrees).

By adopting the oblique ridge stripe type, the optical reflectance of the nonreflectively-coated light-emitting end surface can be set closer to an ideal value of 0%, and as a result, it becomes possible to obtain merits that laser light that circulates within the semiconductor laser device can be prevented from being generated and that generation of collateral laser light accompanying main laser light can be suppressed.

Moreover, since the laminated structure of the present disclosure that is constituted of the AlInGaN-based compound semiconductor efficiently emits green light in particular, it becomes possible to produce a surface-emitting laser device having high luminance efficiency in a green area (vertical resonator laser, also called VCSEL). It should be noted that in this surface-emitting laser device, laser resonances are caused by causing light to resonate between two light reflection layers (Distributed Bragg Reflector layers, DBR layers).

It should be noted that the present disclosure can also take the following configurations.

<<Semiconductor Optical Device>>

A semiconductor optical device, including a laminated structure including a first compound semiconductor layer of an n type, an active layer, and a second compound semiconductor layer of a p type, the active layer including at least 3 barrier layers and well layers interposed among the barrier layers, and the semiconductor optical device satisfying Expression (1) below when a bandgap energy of the barrier layer adjacent to the second compound semiconductor layer is represented by $Eg_{p\text{-}BR}$, a bandgap energy of the barrier layer between the well layers is represented by $Eg_{Well}$, and a bandgap energy of the barrier layer adjacent to the first compound semiconductor layer is represented by $Eg_{n\text{-}BR}$.

$$Eg_{p\text{-}BR} > Eg_{n\text{-}BR} > Eg_{Well} \qquad (1)$$

[A02] The semiconductor optical device according to [A01], in which the second compound semiconductor layer includes a second light guide layer and a second clad layer from the active layer side, and the semiconductor optical device satisfies Expression (2) below when a bandgap energy of the second light guide layer is represented by $Eg_{p\text{-}LG}$, and a bandgap energy of the second clad layer is represented by $Eg_{p\text{-}CL}$.

$$Eg_{p\text{-}LG} < Eg_{p\text{-}BR} < Eg_{p\text{-}CL} \qquad (2)$$

[A03] The semiconductor optical device according to [A01] or [A02], in which the first compound semiconductor layer includes a first light guide layer and a first clad layer from the active layer side, and the semiconductor optical device satisfies Expression (3) below when a bandgap energy of the first light guide layer is represented by $Eg_{n\text{-}LG}$, and a bandgap energy of the first clad layer is represented by $Eg_{n\text{-}CL}$.

$$Eg_{n\text{-}BR} < Eg_{n\text{-}LG} < Eg_{n\text{-}CL} \qquad (3)$$

[A04] The semiconductor optical device according to any one of [A01] to [A03], in which the barrier layer adjacent to the second compound semiconductor layer has a thickness of 25 nm or less.

[A05] The semiconductor optical device according to [A04], in which the barrier layer adjacent to the second compound semiconductor layer has a thickness of 1 nm or more and 5 nm or less.

[A06] The semiconductor optical device according to any one of [A01] to [A05], in which the second compound semiconductor layer is formed by laminating a plurality of compound semiconductor layers, and the compound semiconductor layer having a highest bandgap energy out of the plurality of compound semiconductor layers configuring the second compound semiconductor layer has a thickness of $3*10^{-8}$ m or more.

[A07] The semiconductor optical device according to any one of [A01] to [A06], in which the barrier layer adjacent to the second compound semiconductor layer is compositionally modulated, and a highest value of the bandgap energy satisfies Expression (1).

[A08] The semiconductor optical device according to any one of [A01] to [A06], in which the barrier layer the barrier layer adjacent to the second compound semiconductor layer includes a multistep composition structure in which a composition changes stepwise, and a highest value of the bandgap energy satisfies Expression (1).

[A09] The semiconductor optical device according to any one of [A01] to [A08], in which
the semiconductor optical device satisfies $$Eg_p - Eg_n \geq 20 \text{ meV}$$

$$Eg_n - Eg_{Well} \geq 20 \text{ meV}$$

[A10] The semiconductor optical device according to any one of [A01] to [A09], in which
the laminated structure includes an AlInGaN-based compound semiconductor, and
the semiconductor optical device configures a light-emitting device.

[A11] The semiconductor optical device according to [A10], in which
each of the barrier layers includes $Al_xIn_YGa_{(1-X-Y)}N$ (provided that X≥0, Y≥0), and
the semiconductor optical device satisfies Expression (4) below when a value of Y in the barrier layer adjacent to the second compound semiconductor layer is represented by $Y_{p-BR}$, a value of Y in the barrier layer between the well layers is represented by $Y_{Well}$, and a value of Y in the barrier layer adjacent to the first compound semiconductor layer is represented by $Y_{n-BR}$.

$$Y_{p-BR} < Y_{n-BR} < Y_{Well} \tag{4}$$

[A12] The semiconductor optical device according to any one of [A01] to [A11], in which
the second compound semiconductor layer does not include an electronic barrier layer.

[A13] The semiconductor optical device according to any one of [A01] to [A12], in which
the semiconductor optical device emits light having a wavelength of 440 nm or more and 600 nm.

[B01] The semiconductor optical device according to any one of [A01] to [A13], in which
the well layers include an AlInGaN-based compound semiconductor, and
a value obtained by subtracting, when an indium atom percentage of the AlInGaN-based compound semiconductor in each of the well layers is represented by $Z_{In}$, a minimum value of $Z_{In}$ from a maximum value of $Z_{In}$ in the well layers of the active layer is 0.01 or less.

[B02] The semiconductor optical device according to [B01], in which
a distortion amount distribution exists in an epitaxial growth direction in the well layer adjacent to the first compound semiconductor layer, and a first atomic layer adjacent to the first compound semiconductor layer has a largest distortion amount.

[B03] The semiconductor optical device according to [B02], in which
the laminated structure is formed on a main surface of a GaN substrate that is constituted of a semipolar surface or a nonpolar surface.

[B04] The semiconductor optical device according to [B03], in which
an angle formed between a plane direction of the main surface and a c axis is 45 degrees or more and 80 degrees or less.

[B05] The semiconductor optical device according to [B04], in which
the main surface of the GaN substrate includes a {20-21} surface.

[B06] The semiconductor optical device according to any one of [B02] to [B05], in which
in each of the well layers, a tension distortion is introduced in the first atomic layer positioned on the first compound semiconductor layer side in the epitaxial growth direction.

[B07] The semiconductor optical device according to any one of [B01] to [B06], in which
the value of $Z_{In}$ in each of the well layers is 0.15 or more and 0.50 or less.

[B08] The semiconductor optical device according to [B07], in which
the value of $Z_{In}$ in each of the well layers is 0.20 or more and 0.45 or less.

[B09] The semiconductor optical device according to [B07] or [B08], in which
the barrier layers include an AlInGaN-based compound semiconductor, and
when an indium atom percentage of the AlInGaN-based compound semiconductor in the barrier layers is represented by $Y_{In}$, a value of $Y_{In}$ in the barrier layers is 0.08 or less.

REFERENCE SIGNS LIST

11 GaN substrate
12 main surface of GaN substrate
13 buffer layer
20 ridge stripe structure
21 light-emitting end surface (first end surface)
22 light reflection end surface (second end surface)
30 laminated structure
31 first compound semiconductor layer
31A first light guide layer
31B first clad layer
32 second compound semiconductor layer
32A second light guide layer
32B second clad layer
33 active layer
$33A_1$, $33A_2$, $33A_3$ barrier layer
$33B_1$, $33B_2$ well layer
34 contact layer
35 insulation layer
41 first electrode
42 second electrode

The invention claimed is:
1. A semiconductor optical device, comprising:
a laminated structure that includes:
a first compound semiconductor layer of an n type;
a second compound semiconductor layer of a p type; and
an active layer including at least three barrier layers and a plurality of well layers among the at least three barrier layers,
wherein a first barrier layer of the at least three barrier layers, adjacent to the second compound semiconductor layer, has a first bandgap energy represented by $Eg_{p-BR}$,
wherein a second barrier layer of the at least three barrier layers, between the plurality of well layers, has a second bandgap energy represented by $Eg_{Well}$,
wherein a third barrier layer of the at least three barrier layers, adjacent to the first compound semiconductor layer, has a third bandgap energy represented by $Eg_{n-BR}$, and
wherein the first bandgap energy, the second bandgap energy, and the third bandgap energy satisfy below Expression (1)

$$Eg_{p-BR} > Eg_{n-BR} > Eg_{Well} \tag{1}.$$

2. The semiconductor optical device according to claim 1, wherein
the second compound semiconductor layer includes a light guide layer and a clad layer from a side of the active layer,
wherein the light guide layer has a fourth bandgap energy represented by $Eg_{p\text{-}LG}$,
wherein the clad layer has a fifth bandgap energy represented by $Eg_{p\text{-}CL}$, and
wherein the first bandgap energy, the fourth bandgap energy, and the fifth bandgap energy satisfy below Expression (2)

$$Eg_{p\text{-}LG} < Eg_{g\text{-}BR} < Eg_{p\text{-}CL} \tag{2}.$$

3. The semiconductor optical device according to claim 1, wherein
the first compound semiconductor layer includes a light guide layer and a clad layer from a side of the active layer,
wherein the light guide layer has a fourth bandgap energy represented by $Eg_{n\text{-}LG}$,
wherein the clad layer has a fifth bandgap energy represented by $Eg_{n\text{-}CL}$, and
wherein the third bandgap energy, the fourth bandgap energy, and the fifth bandgap energy satisfy below Expression (3)

$$Eg_{n\text{-}BR} < Eg_{n\text{-}LG} < Eg_{n\text{-}CL} \tag{3}.$$

4. The semiconductor optical device according to claim 1, wherein
the first barrier layer adjacent to the second compound semiconductor layer has a thickness value of 25 nm or less.

5. The semiconductor optical device according to claim 4, wherein
the first barrier layer adjacent to the second compound semiconductor layer has the thickness value of 1 nm or more and 5 nm or less.

6. The semiconductor optical device according to claim 1, wherein
the second compound semiconductor layer includes a plurality of compound semiconductor layers,
wherein the plurality of compound semiconductor layers are laminated, and
wherein at least one compound semiconductor layer of the plurality of compound semiconductor layers, that has a highest bandgap energy among the plurality of compound semiconductor layers, has a thickness value of $3*10^{-8}$ m or more.

7. The semiconductor optical device according to claim 1, wherein
the first barrier layer adjacent to the second compound semiconductor layer is compositionally modulated,
wherein the first barrier layer is associated with a plurality of bandgap energies, and
wherein a highest value among values of the plurality of bandgap energies corresponds to the first bandgap energy.

8. The semiconductor optical device according to claim 1, wherein
the first barrier layer adjacent to the second compound semiconductor layer includes a multistep composition structure in which a composition changes stepwise,
wherein the first barrier layer is associated with a plurality of bandgap energies, and
wherein a highest value among values of the plurality of bandgap energies corresponds to the first bandgap energy.

9. The semiconductor optical device according to claim 1, wherein
the semiconductor optical device satisfies $$Eg_p - Eg_n \geq 20 \text{ meV, and}$$

$$Eg_n - Eg_{Well} \geq 20 \text{ meV}.$$

10. The semiconductor optical device according to claim 1, wherein
the laminated structure includes an AlInGaN-based compound semiconductor, and
the semiconductor optical device configures a light-emitting device.

11. The semiconductor optical device according to claim 10, wherein
each of the at least three barrier layers includes $Al_X In_Y Ga_{(1-X-Y)}N$ (provided that $X \geq 0$, $Y \geq 0$),
wherein the first barrier layer has a first value of Y represented by $Y_{p\text{-}BR}$,
wherein the second barrier layer has a second value of Y represented by $Y_{Well}$, and
wherein the third barrier layer has a third value of Y represented by $Y_{n\text{-}BR}$, and
wherein the first value of Y, the second value of Y, and the third value of Y satisfy below Expression (4)

$$Y_{p\text{-}BR} < Y_{n\text{-}BR} < Y_{Well} \tag{4}.$$

12. The semiconductor optical device according to claim 1, wherein
the second compound semiconductor layer lacks an electronic barrier layer.

13. A semiconductor optical device, comprising:
a laminated structure that includes:
a first compound semiconductor layer of an n type;
a second compound semiconductor layer of a p type; and
an active layer that includes at least three barrier layers and a plurality of well layers among the at least three barrier layers,
wherein a first barrier layer of the at least three barrier layers, adjacent to the second compound semiconductor layer, has a first bandgap energy represented by $Eg_{p\text{-}BR}$,
wherein a second barrier layer of the at least three barrier layers, between the plurality of well layers, has a second bandgap energy represented by $Eg_{Well}$,
wherein a third barrier layer of the at least three barrier layers, adjacent to the first compound semiconductor layer, has a third bandgap energy represented by $Eg_{n\text{-}BR}$,
wherein the second compound semiconductor layer includes a light guide layer and a clad layer from a side of the active layer,
wherein the light guide layer of the second compound semiconductor layer has a fourth bandgap energy represented by $Eg_{p\text{-}LG}$,
wherein the clad layer of the second compound semiconductor layer has a fifth bandgap energy represented by $Eg_{p\text{-}CL}$,
wherein the first bandgap energy, the second bandgap energy, and the third bandgap energy satisfy below Expression (1)

$$Eg_{p\text{-}BR} > Eg_{n\text{-}BR} > Eg_{Well} \tag{1, and}$$

wherein the first bandgap energy, the fourth bandgap energy, and the fifth bandgap energy satisfy below Expression (2)

$$Eg_{p-LG} < Eg_{p-BR} < Eg_{p-CL} \qquad (2).$$

14. A semiconductor optical device, comprising:
a laminated structure that includes:
a first compound semiconductor layer of an n type;
a second compound semiconductor layer of a p type; and
an active layer that includes at least three barrier layers and a plurality of well layers among the at least three barrier layers,
wherein a first barrier layer of the at least three barrier layers, adjacent to the second compound semiconductor layer, is compositionally modulated,
wherein the first barrier layer is associated with a plurality of bandgap energies,
wherein a first bandgap energy of the plurality of bandgap energies, represented by $Eg_{p-BR}$, has a highest value among values of the plurality of bandgap energies,
wherein a second barrier layer of the at least three barrier layers, between the plurality of well layers, has a second bandgap energy represented by $Eg_{Well}$,
wherein a third barrier layer of the at least three barrier layers, adjacent to the first compound semiconductor layer, has a third bandgap energy represented by $Eg_{n-BR}$, and
wherein the first bandgap energy, the second bandgap energy, and the third bandgap energy satisfy below Expression (1)

$$Eg_{p-BR} > Eg_{n-BR} > Eg_{Well} \qquad (1).$$

* * * * *